(12) United States Patent
Vincent et al.

(10) Patent No.: US 9,331,029 B2
(45) Date of Patent: May 3, 2016

(54) MICROELECTRONIC PACKAGES HAVING MOLD-EMBEDDED TRACES AND METHODS FOR THE PRODUCTION THEREOF

(71) Applicants: Michael B. Vincent, Chandler, AZ (US); Zhiwei Gong, Chandler, AZ (US); Jason R. Wright, Chandler, AZ (US)

(72) Inventors: Michael B. Vincent, Chandler, AZ (US); Zhiwei Gong, Chandler, AZ (US); Jason R. Wright, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 14/210,057

(22) Filed: Mar. 13, 2014

(65) Prior Publication Data
US 2015/0262931 A1    Sep. 17, 2015

(51) Int. Cl.
*H01L 21/44* (2006.01)
*H01L 23/66* (2006.01)
(Continued)

(52) U.S. Cl.
CPC .......... *H01L 23/66* (2013.01); *H01L 21/4853* (2013.01); *H01L 21/565* (2013.01); *H01L 21/568* (2013.01); *H01L 21/6836* (2013.01); *H01L 21/76838* (2013.01); *H01L 21/76841* (2013.01); *H01L 21/78* (2013.01); *H01L 23/3107* (2013.01); *H01L 23/49883* (2013.01); *H01L 23/5383* (2013.01); *H01L 25/16* (2013.01); *H01L 25/50* (2013.01); *H01L 23/49816* (2013.01); *H01L 23/5328* (2013.01); *H01L 23/5389* (2013.01); *H01L 2221/68372* (2013.01); *H01L 2223/6677* (2013.01); *H01L 2224/04105* (2013.01); *H01L 2224/05548* (2013.01); *H01L 2224/12105* (2013.01); *H01L 2224/18* (2013.01); *H01L 2224/24145* (2013.01); *H01L 2224/24225* (2013.01); *H01L 2224/32145* (2013.01); *H01L 2224/32153* (2013.01); *H01L 2224/32221* (2013.01); *H01L 2224/73267* (2013.01); *H01L 2924/19041* (2013.01); *H01L 2924/19042* (2013.01); *H01L 2924/19043* (2013.01); *H01L 2924/19104* (2013.01)

(58) Field of Classification Search
CPC .......... H01L 2224/04105; H01L 2224/05548; H01L 2224/32151; H01L 2224/32153; H01L 2224/32221; H01L 21/568
USPC .................................. 438/107–109, 111, 112
See application file for complete search history.

(56) References Cited

U.S. PATENT DOCUMENTS

| | | | |
|---|---|---|---|
| 6,680,529 B2 | 1/2004 | Chen et al. | |
| 2010/0090322 A1* | 4/2010 | Hedler ................ | H01L 23/3114 257/676 |

(Continued)

*Primary Examiner* — Matthew E Warren
(74) *Attorney, Agent, or Firm* — Ingrassia Fisher & Lorenz, P.C.

(57) ABSTRACT

Methods for fabricating microelectronic packages, such as Fan-Out Wafer Level Packages, and microelectronic packages are provided. In one embodiment, the method includes placing a first semiconductor die on a temporary substrate, forming an electrically-conducive trace in contact with at least one of the first semiconductor die and the temporary substrate, and encapsulating the first semiconductor die and the electrically-conductive trace within a molded panel. The temporary substrate is removed to reveal a frontside of the molded panel through which the electrically-conducive trace is at least partially exposed. At least one redistribution layer is formed over the frontside of the molded panel, the at least one redistribution layer comprises an interconnect line in ohmic contact with the electrically-conducive trace.

20 Claims, 8 Drawing Sheets

(51) Int. Cl.
*H01L 21/768* (2006.01)
*H01L 21/56* (2006.01)
*H01L 21/78* (2006.01)
*H01L 23/31* (2006.01)
*H01L 25/00* (2006.01)
*H01L 25/16* (2006.01)
*H01L 21/48* (2006.01)
*H01L 23/538* (2006.01)
*H01L 21/683* (2006.01)
*H01L 23/498* (2006.01)
*H01L 23/532* (2006.01)

(56) References Cited

U.S. PATENT DOCUMENTS

| 2011/0037159 | A1 | 2/2011 | Mcelrea et al. |
| 2011/0147906 | A1 | 6/2011 | Yang et al. |
| 2011/0210442 | A1 | 9/2011 | Lim et al. |
| 2011/0227217 | A1* | 9/2011 | Suh ............ H01L 21/561 257/737 |
| 2011/0316156 | A1* | 12/2011 | Pagaila ........ H01L 21/561 257/738 |
| 2014/0332976 | A1* | 11/2014 | Chen ............ H01L 21/76877 257/774 |

* cited by examiner

US 9,331,029 B2

MICROELECTRONIC PACKAGES HAVING MOLD-EMBEDDED TRACES AND METHODS FOR THE PRODUCTION THEREOF

TECHNICAL FIELD

Embodiments of the present invention relate generally to microelectronic packaging and, more particularly, to microelectronic packages and method for fabricating microelectronic packages having electrically-conductive traces, such as printed ink traces, embedded within a molded package body.

BACKGROUND

Fan-Out Wafer Level Packaging processes are well-known within the semiconductor industry for producing microelectronic packages having peripheral fan-out areas, which enlarge the surface area of the package frontside over which a contact array can be formed. Fan-Out Wafer Level Packages ("FO-WLPs") are commonly produced as System-in-Packages ("SiPs") containing multiple microelectronic components, which are interconnected by redistribution layers formed over the molded package body. For example, a FO-WLP may be produced to include multiple Surface Mount Devices ("SMDs") in addition to one or more semiconductor die. While enhancing the functionality of the package, the inclusion of multiple microelectronic components in a single package can require an increase in the number and/or wiring density of the redistribution layers. Such an increase in redistribution layer number and/or wiring density may increase package height and add undesired cost, complexity, and delay to the package fabrication process. Additionally, higher redistribution layer counts and wiring densities can increase the likelihood of redistribution layer delamination during or after fabrication of the FO-WLP.

It is thus desirable to provide FO-WLPs and methods for fabricating FO-WLPs (or other microelectronic packages) containing multiple microelectronic components, which provide greater flexibility in the manner in which microelectronic components are interconnected. Ideally, embodiments of such FO-WLPs and package fabrication methods would enable a reduction in number, wiring density, or overall complexity of any redistribution layers included within the FO-WLPs. Other desirable features and characteristics of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

Figure 1:
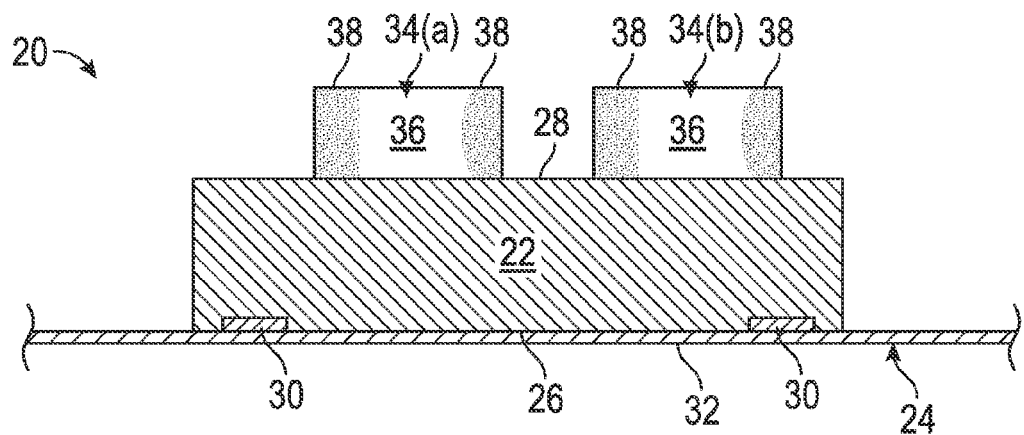
FIGS. 1-9 are cross-sectional views (with the exception of FIGS. 2 and 6, which are top-down views) of a FO-WLP including mold-embedded traces utilized to interconnect a die with a number of surface mount devices encapsulated within the package body, as shown at various stages of completion and illustrated in accordance with a first exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes embodiments of microelectronic packages and methods for producing microelectronic packages having electrically-conductive traces embedded within a molded package body. In certain embodiments, the traces can be discrete pieces of metal placed in desired positions utilizing, for example, a pick-and-place tool. It is preferred, however, that the electrically-conductive traces are produced utilizing a printing process, such as an inkjet printing, an aerosol printing, or a fine needle dispensing process. Prior to encapsulation, the electrically-conductive traces can be printed directly onto one or more surfaces of at least one semiconductor die, on the surface of the temporary substrate utilized to support the die during the encapsulation process, and/or on the surfaces of any additional microelectronic components (e.g., SMDs) placed on or adjacent the semiconductor die. The traces are then embedded along with the semiconductor die and any other additional microelectronic components in a molded panel during an encapsulation or overmolding process. After additional processing steps, such as the build-up of one or more redistribution layers over the frontside of the molded panel and production of a contact array (e.g., a frontside Ball Grid Array or "BGA"), the molded panel can then be singulated to yield a plurality of completed microelectronic packages (e.g., FO-WLPs), each including a molded package body having a series or network of traces embedded therein. The integration of mold-embedded traces into a FO-WLP provides significant flexibility in designing the wiring or routing infrastructure of the package.

The electrically-conductive traces embedded within the package body can be utilized for a number of different purposes, including the formation of interconnections within the FO-WLP itself. In this regard, the mold-embedded traces can interconnect a semiconductor die with any number and combination of additional microelectronic components embedded within the package body (e.g., one or more additional semiconductor die, an array of SMDs, or another microelectronic component). In this manner, the FO-WLP fabrication process can be utilized to produce multi-component SiP packages having high levels of interconnection and volumetric efficiency.

Additionally or alternatively, the mold-embedded traces can be utilized to produce electrically-conductive paths from the semiconductor die to external surfaces of the package body. For example, the mold-embedded traces can be printed or otherwise produced to extend to the backside of the package body to create through vias in an efficient and cost-effective manner. Similarly, mold-embedded traces contained within a first FO-WLP can be produced to extend to the package sidewall to allow interconnection with another microelectronic package, such as a second FO-WLP bonded to the first FO-WLP in a Package-on-Package ("PoP") configuration. In still further embodiments, the mold-embedded traces can be utilized to provide electrical interconnections with other functional structures disposed within the package body, which can be integrally produced with one or more of the traces as a unitary or monolithic printed structure. For example, the mold-embedded traces can be utilized to interconnect a semiconductor die to a printed capacitor, a printed inductor, a printed resistor, a printed Radio Frequency ("RF") antenna structure, or a similar electrically-conductive structure formed in conjunction with the mold-embedded traces utilizing a common printing process. The inclusion of mold-embedded traces within the package body thus presents many design possibilities and can greatly increase the overall interconnectivity, volumetric efficiency, and functionality of the FO-WLP.

As the mold-embedded traces can be printed to conform to the surfaces of the temporary substrate and the microelectronic components supported thereby, the traces can extend in three dimensions and effectively form at least one three dimensional wiring layer or metal level. Such a three dimensional wiring level should be contrasted with the two dimensional metal levels of the type formed within the redistribution layers, which are inherently planar by design. Considering this, embodiments of the below-described fabrication method may also be regarded as producing three dimensional embedded metal levels, which are conformal with surfaces of the encapsulated microelectronic components and the temporary substrate utilized to support the components during encapsulation (and, therefore, also conformal with the frontside of the package body after removal of the temporary substrate). Such three dimensional embedded metal levels can help complete the routing structure of the FO-WLP and thereby reduce the number, complexity, and/or wiring density of the redistribution layers formed over the molded package body. In so doing, the overall cost, size, and complexity of the FO-WLP is favorably reduced. Furthermore, such reduction in the number or complexity of the redistribution layers can effectively minimize stress imparted to the redistribution layers during or after package fabrication to decrease the likelihood of redistribution layer delamination. An example of one manner in which a number of FO-WLPs including mold-embedded traces can be produced will now be described below in conjunction with FIGS. 1-9. Additional examples of FO-WLPs including mold-embedded traces of various types are further described below in conjunction with FIGS. 10-16.

FIGS. 1-9 illustrate a FO-WLP 20 at various stages of manufacture and produced in accordance with an exemplary embodiment of the present invention. FO-WLP 20 is fabricated utilizing a molded panel process during which a die-containing molded panel (e.g., panel 50 shown in FIG. 6 and described below) is produced, processed, and, in most cases, singulated to yield a number of completed FO-WLPs including package 20. The other microelectronic packages produced in parallel with FO-WLP 20 may or may not be substantially identical to package 20; however, the process steps described herein will typically be performed globally across the molded panel and are consequently generally descriptive of the processing of the panel, as a whole. In this particular example, FO-WLP 20 (and the other packages fabricated in parallel with package 20) is produced to include a number of SMDs in addition to a semiconductor die; thus, FO-WLP 20 can also be considered a SiP device.

Referring initially to FIG. 1, fabrication of FO-WLP 20 commences with the positioning of semiconductor die 22 on a temporary substrate 24 (partially shown). While only a single semiconductor die 22 is placed on the illustrated portion of temporary substrate 24 (corresponding to FO-WLP 20), it will be appreciated that various other semiconductor die are distributed across the non-illustrated regions of substrate 24 (e.g., a relatively large array of semiconductor die can be distributed across substrate 24 in, for example, a grid pattern). At this juncture in the fabrication process, each semiconductor die 22 has undergone wafer-level processing to produce one or more integrated circuits thereon. Semiconductor die 22 each include a frontside 26, a backside 28, and a number of bond pads 30 disposed on frontside 26. When placed onto substrate 24, semiconductor die 22 is inverted and positioned facedown such that bond pads 30 of die 22 are placed in contact with the upper surface of temporary substrate 24. Temporary substrate 24 can be any body, structure, or platform suitable for supporting semiconductor die 22 and the other non-illustrated die during the below-described encapsulation process. In one embodiment, temporary substrate 24 is a taped mold frame, which includes a soft tape adhesive layer 32 onto which semiconductor die 22 are placed.

Figure 2:
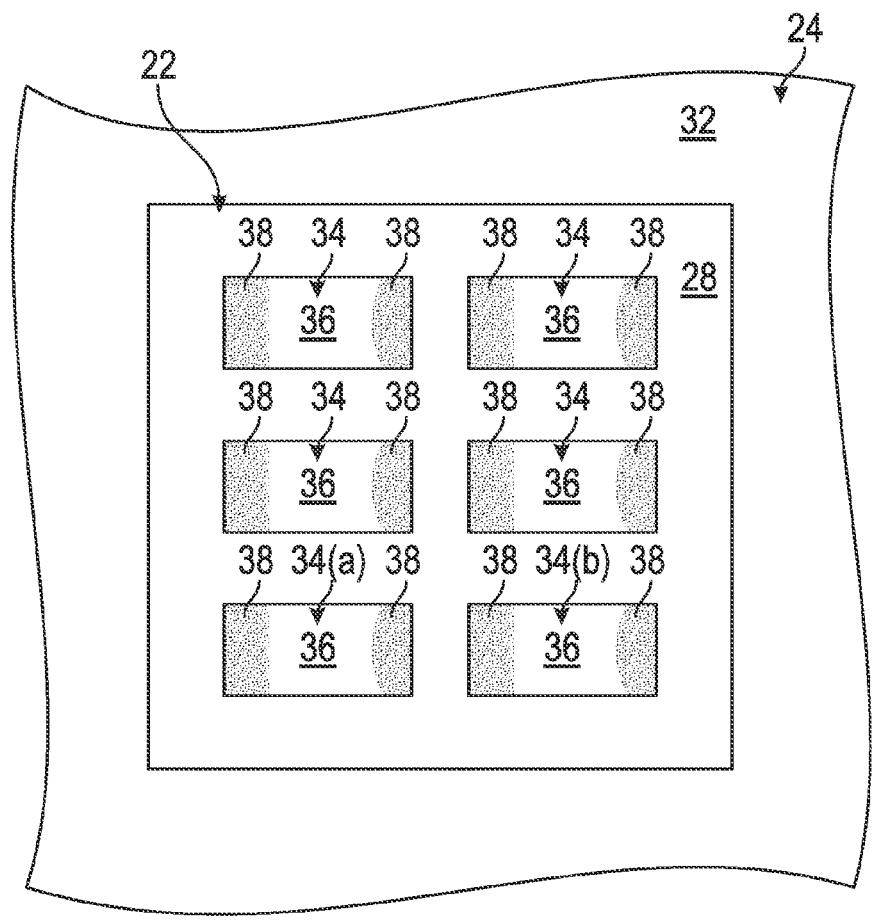

One or more Surface Mount Devices are next placed onto or adjacent the semiconductor die 22. As appearing herein, the term "Surface Mount Device" and the corresponding acronym "SMD" refer to a discrete microelectronic device directly mountable on the surface of a substrate, such as a PCB, having electrical points-of-contact with which the SMD can be placed in ohmic contact. For example, as indicated in FIG. 1, a number of SMDs 34 can be positioned on the backside 28 of each semiconductor die 22. In certain cases, SMDs 34 are placed in an array containing one or more rows of SMDs. For example, as shown in FIG. 2 (a top-down view of die 22, SMDs 34, and the surrounding region of temporary substrate 24), two rows of three SMDs 34 can be placed on the backside 28 of each die 22 using a pick-and-place tool or similar device. This example notwithstanding, it will be appreciated that the number of SMDs 34 positioned on the backside of each die 22 and the spatial arrangement of the SMDs 34 will vary among embodiments. Indeed, the number of SMDs 34 positioned on the backside of die 22 is limited only by die size, SMD size, and the desired minimum clearance or spacing between neighboring SMDs. SMDs 34 can be, for example, discrete resistors, capacitors, inductors, diodes, or any combination thereof. In many cases, SMDs 34 will be two terminal devices each having a generally rectangular body 36 (as viewed from the side, top, or bottom), which is flanked by electrically-conductive end terminals 38. The SMD terminals can include gold, copper, or another electrically-conductive material and may or may not have a surface finish.

Figure 3:
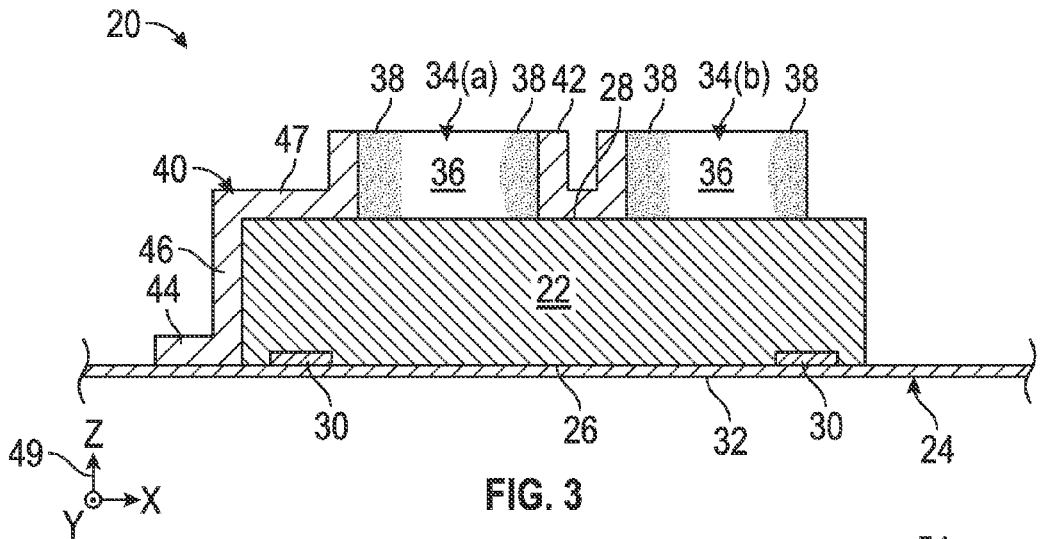

After placement of SMDs 34 in their desired positions, a number of electrically-conductive traces or circuit lines are formed over semiconductor die 22 and in ohmic contact with terminals 38 of SMDs 34. FIG. 3 illustrates partially-completed FO-WLP 20 after the formation of a number of electrically-conductive traces in ohmic contact with the terminals 38 of SMDs 34. Two traces 40 and 42 can be seen in the cross-sectional view shown in FIG. 3. However, it will be understood that additional traces can likewise be formed over the other non-illustrated regions of FO-WLP 20 and the other packages produced in parallel therewith. With respect to FO-WLP 20, in particular, additional non-illustrated traces are formed in ohmic contact with the terminals 38 of the other SMDs 34 shown in FIG. 2.

One or more of the above-described traces can be formed via the strategic placement of discrete pieces of metal, such pieces of etched foil or small segments of copper wires. In this case, a conductive bonding material can be utilized to bond the discrete pieces of metal to the SMD terminals. However, for manufacturing efficiency, it is preferred that the traces are formed by printing an electrically-conductive ink onto one or more surfaces of temporary substrate 24, semiconductor die 22, and the overlying SMDs 34. For this reason, traces 40 and 42 will be referred to hereafter as "printed ink traces" or "electrically-conductive ink traces" with the understanding that (unless otherwise specified) the traces can be produced utilizing non-printing processes and from material other than electrically-conductive ink in at least some embodiments.

As appearing in the proceeding paragraph and elsewhere in this document, the term "printing process," the term "print," and similar terms are utilized broadly refer to deposition processes allowing a flowable electrically-conductive material, such as a metal-containing ink, to be selectively dispensed or applied to one or more surfaces as, for example, circuit line or trace. The term "trace," in turn, is utilized to refer to an electrically-conductive structure or line providing electrical interconnection between two points or nodes within a package. As further appearing herein, the term "ink" is defined to encompass any electrically-conductive material, such as a liquid or suspension containing metal particles, that is sufficiently flowable under process conditions to allow printing of electrically-conductive circuit lines or traces of the type described below.

Printed ink trace 40, printed ink trace 42, and the other non-illustrated ink traces can be printed utilizing any dispensing technique allowing the selective deposition of an electrically-conductive ink in a predetermined pattern or design. A non-exhaustive list of suitable printing techniques includes inkjet printing, aerosol printing, and needle dispensing techniques. In embodiments wherein such printing processes are employed, the traces may be printed conformally to exposed surfaces of the microelectronic devices, conformally to the support surface of the temporary substrate, or as vertically-freestanding columns which extend away from the surfaces along the Z-axis (identified in FIG. 3). If printed adjacent a sidewall surface of a semiconductor die, the trace may adhere to and extend along the sidewall surface to, for example, create an electrically-conductive path from the redistribution layer interface to the backside of the die, as described more fully below. Additionally, in embodiments wherein the ink traces are substantially planar, such as in the embodiment shown in FIGS. 11 and 12, a screen printing technique can be employed. Suitable electrically-conductive inks include, but are not limited to, inks containing relatively small metal particles, such as gold or silver particles in the nanometer range (e.g., particles having average diameters ranging from about 2 to about 50 nanometers). Thermal or ultraviolet curing can be performed after printing of the electrically-conductive ink traces, as appropriate.

With continued reference to the exemplary embodiment shown in FIG. 3, ink trace 40 is printed to include an enlarged pad region 44, which is formed in contact with temporary substrate 24; a vertically-extending portion 46, which extends along a sidewall of die 22 in a direction away from temporary substrate 24 (along the Z-axis identified by coordinate legend 49 in FIG. 3); and a horizontally-extending terminal end portion 47, which extends over a region of backside 28 of die 22. Printed ink trace 40 thus extends along and is substantially conformal with multiple surfaces, which are collectively presented by substrate 24, die 22, and SMDs 34 and generally meeting at right angles. Furthermore, horizontally-extending end portion 47 of trace 40 contacts a terminal 38 of the leftmost SMD 34 shown in FIG. 3 (identified as SMD "34(a)"). Trace 40 thus extends from SMD 34(a) to the upper surface of temporary substrate 24, which will ultimately define the frontside surface of the molded panel over which the redistribution layers are built and, after panel singulation, the frontside surface of the molded package body of the completed FO-WLP 20. By comparison, printed ink trace 42 is formed exclusively on backside 28 of die 22 to interconnect the opposing terminal of SMD 34(a) with the adjacent terminal of the rightmost SMD 34 shown in FIG. 3 (identified as "SMD 34(b)").

After formation of trace 40, trace 42, and the other non-illustrated printed traces, an encapsulation process is carried-out (also commonly referred to as "panelization" or "overmolding"). During the encapsulation process, a non-illustrated mold frame having a central cavity or opening therein can be positioned over tape layer 32 and around the semiconductor die disposed thereon. An electrically-insulative encapsulant or mold compound, such as a silica-filled epoxy, is dispensed into the cavity of the mold frame. The encapsulant flows over and around semiconductor die 22, SMDs 34, and the printed traces. The encapsulant can then be solidified by thermal curing (e.g., heating in a partially-evacuated chamber) to yield a solid panel in which die 22 are embedded. The panel is conveniently produced as a relatively thin, disc-shaped body or mass having a generally circular planform geometry; however, the panel body can be fabricated to have any desired shape and dimensions. In other embodiments, the panel can be produced utilizing various other known fabrication techniques including, for example, compression molding and lamination processes.

Figure 4:
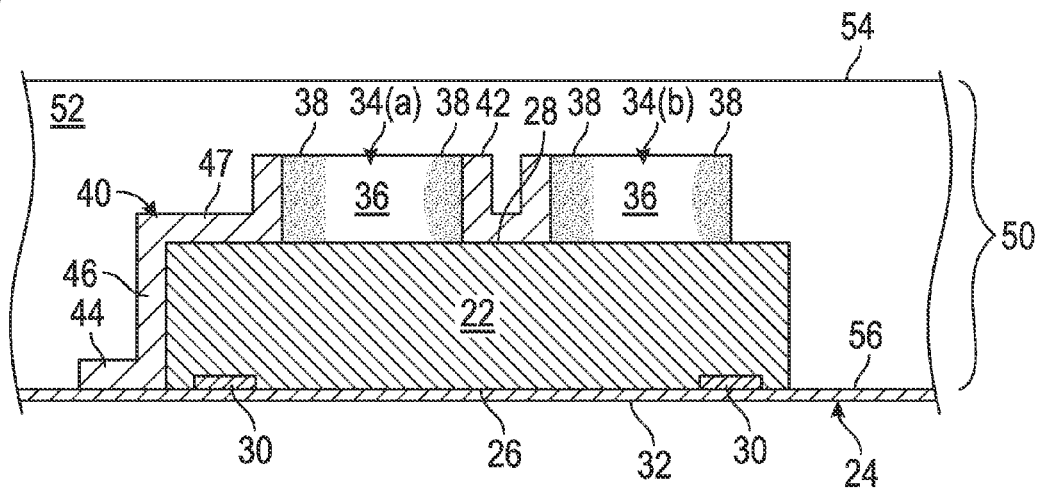
Figure 5:
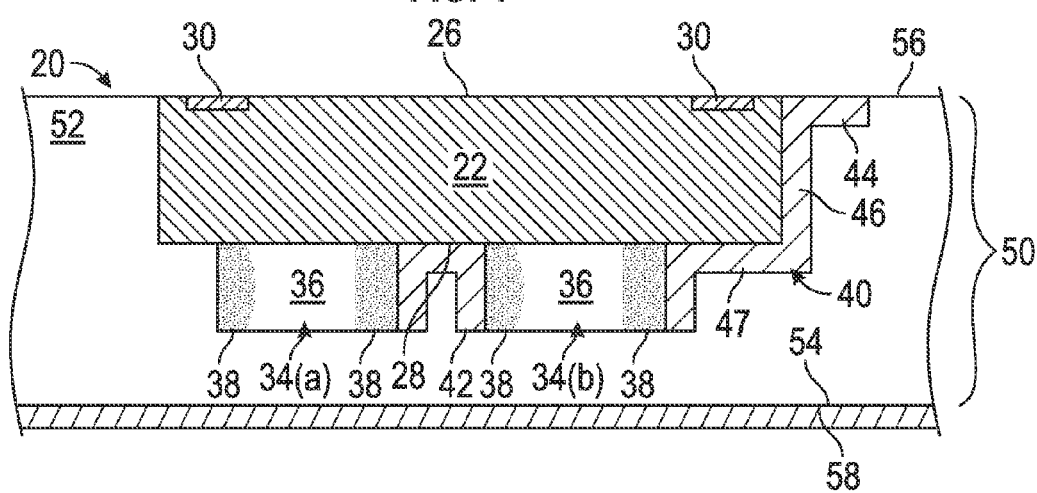
Figure 6:
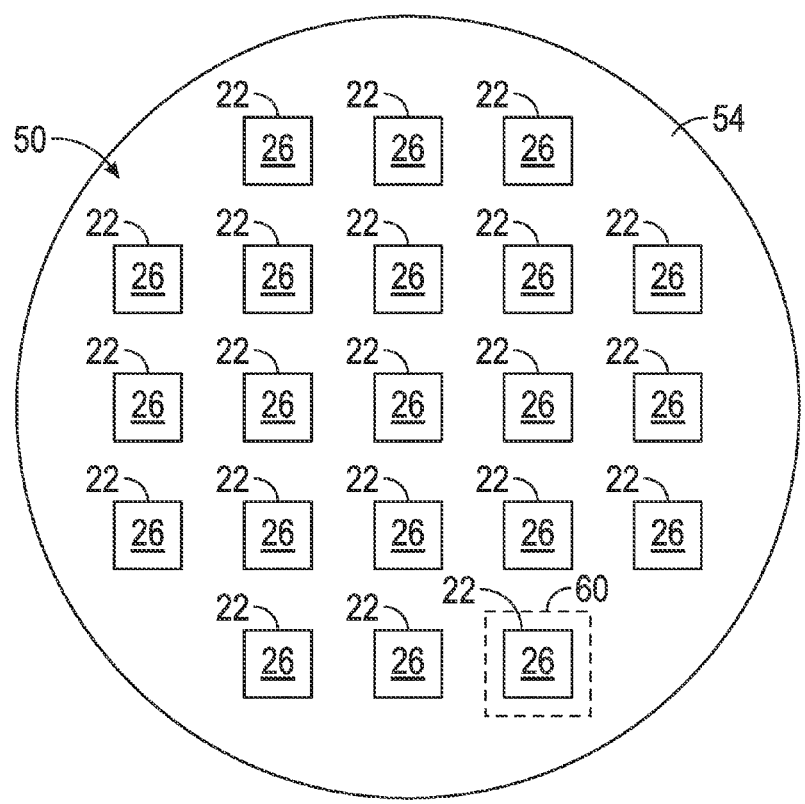

FIG. 4 illustrates a portion of a molded panel 50, which is produced pursuant to the above-described encapsulation process and which encompasses partially-completed FO-WLP 20. While only the portion of molded panel 50 corresponding to FO-WLP 20 is shown in FIG. 4 for clarity, it will be understood that molded panel 50 will typically be considerably larger than the illustrated portion and contains other die, SMDs, and printed traces similar or identical to those shown in the drawing figures. Molded panel 50 includes a panel body 52 having a backside 54 and an opposing frontside 56 (the upper and lower principal surfaces, respectively, in the inverted orientation shown in FIG. 4). After encapsulation, molded panel 50 can be thermally released or otherwise removed from temporary substrate 24 to reveal frontside 56 of panel body 52. Bond pads 30 of semiconductor die 22 are exposed through frontside 56 of molded panel 50, as is pad region 44 of printed trace 40. Additional processing of molded panel 50 can be performed after release from substrate 24 (e.g., panel 50 can be cleaned to remove any adhesive residue present thereon, further curing of panel 50 can be performed by oven bake, and so on). Molded panel 50 is then inverted and attached to a support structure, such as a ceramic carrier 58 (FIG. 5). FIG. 6 illustrates molded panel 50, in its entirety, from a top-down view wherein dashed region 60 corresponds to partially-fabricated FO-WLP 20 and the regions of the mold-embedded traces exposed through panel frontside 56 are not shown for clarity. While only a relatively small number of semiconductor die 22 are embedded with the exemplary molded panel 50 shown in FIG. 6, it will be appreciated that any practical number of semiconductor die and other microelectronic components can be encapsulated within panel 50 in further embodiments.

Figure 7:
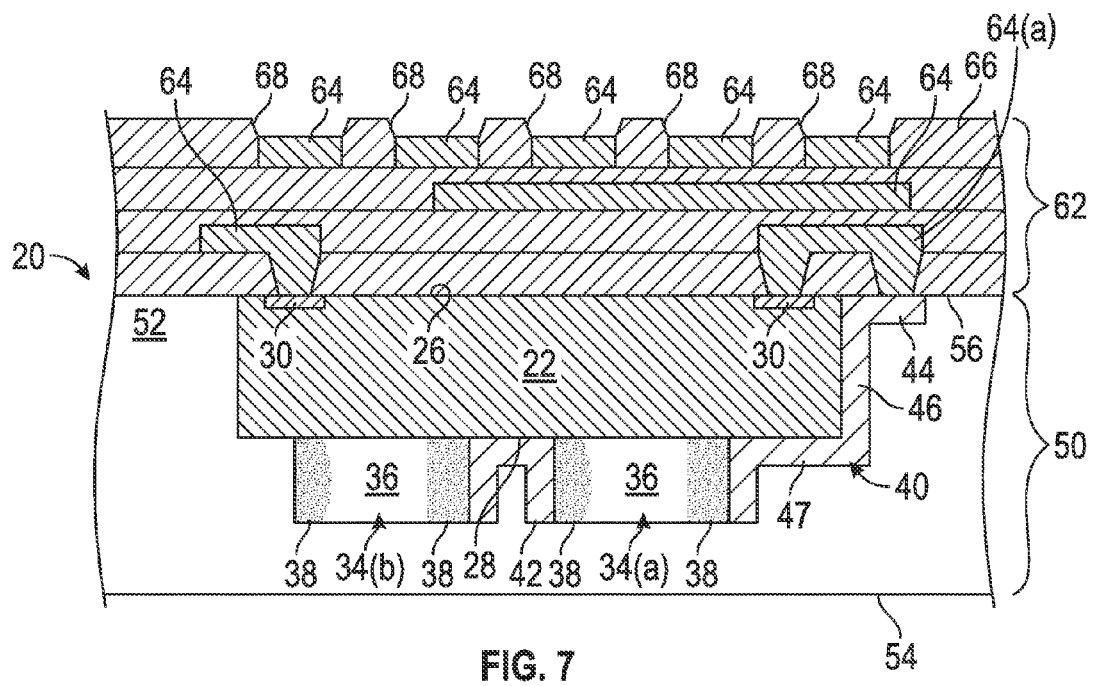

With frontside 56 of molded panel 50 now facing upwards, one or more redistribution layers (also commonly referred to as "build-up layers" or "metal levels") can be built over panel 50 and, therefore, over semiconductor die 22. For example, as shown in FIG. 7, a number of redistribution layers 62 can be produced over frontside 56 of molded panel 50. redistribution layers 62 include a plurality of interconnect lines 64, which are disposed within a body of dielectric material 66. Dielectric body 66 can be formed as a number of successively-deposited (e.g., spun-on) dielectric layers, while interconnect lines 64 can be formed within dielectric body 66 utilizing well-known lithographical patterning and conductive material (e.g., copper) deposition techniques. In one embodiment, each metal level is produced by patterning a mask layer deposited over a seed layer, plating exposed regions of the seed layer with copper or another metal, and then removing the mask layer to define the desired electrically-conductive features. Interconnect lines 64 can comprise various metal traces, vias, metal plugs, and/or the like, which collectively provide electrically-conductive paths between the upper surface of redistribution layers 62 and semiconductor die 22. Additionally, certain interconnect lines 64 can be formed in ohmic contact with one or more of the printed traces embedded within panel body 52. For example, as shown near the right hand side of FIG. 7, an interconnect line 64(*a*) can be formed in ohmic contact with pad region 44 of printed trace 40 to complete the interconnect between die 22 and SMD 34(*a*), as described more fully below.

Figure 8:
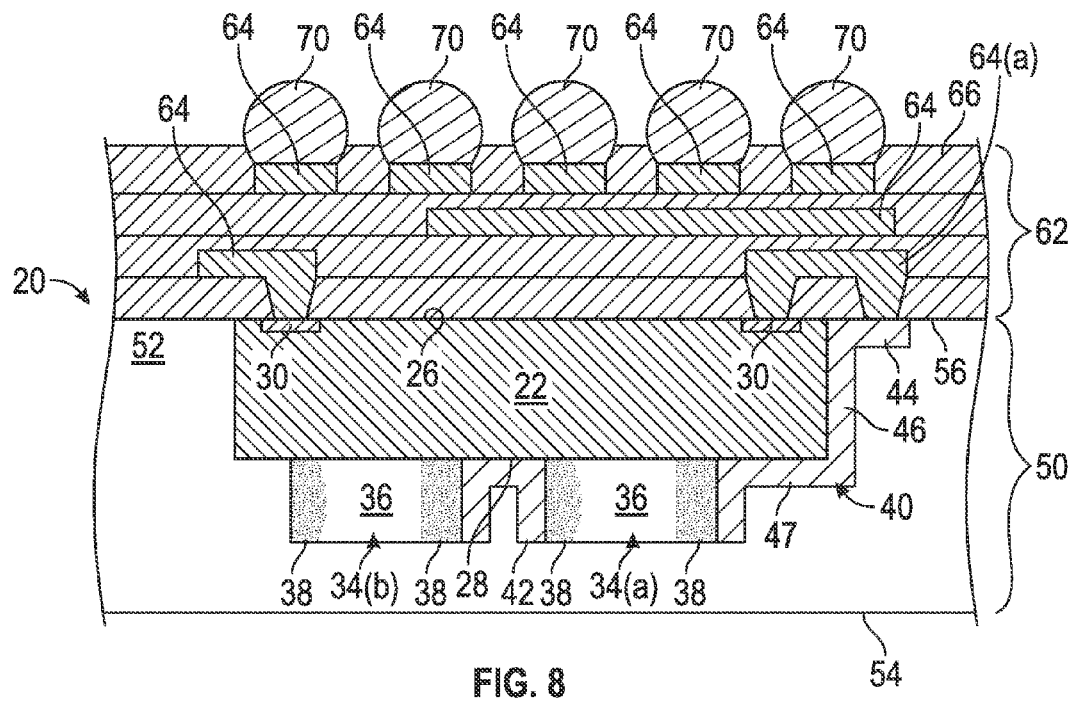

After build-up of redistribution layers 62, trenches or openings 68 (FIG. 7) are formed in the uppermost redistribution layer (e.g., a capping, passivation, or solder mask layer) by lithographical patterning to expose selected regions of interconnect lines 64. A frontside contact array can then be produced over the frontside of partially-completed FO-WLP 20 and in ohmic contact with the exposed regions of interconnect lines 64. For example, as shown in FIG. 8, the frontside contact array can be produced as a first BGA including a plurality of solder balls 70 deposited into the openings formed in the outermost RDL dielectric layer (e.g., a capping or solder mask layer) and in ohmic contact with interconnect lines 64. In further embodiments, the frontside contact array (and the other contact arrays described herein) can assume various other forms suitable for providing externally-accessible points-of-contact to the interconnect lines embedded within redistribution layers 62. Various additional structural features can also be produced in further embodiments of FO-WLP 20, such as backside redistribution layers and backside contact arrays. Afterwards, molded panel 50 is singulated to separate FO-WLP 20 and the other microelectronic packages into discrete units. Singulation is conveniently carried-out utilizing a dicing saw; however, other singulation processes can also be utilized including, for example, laser cutting.

Figure 9:
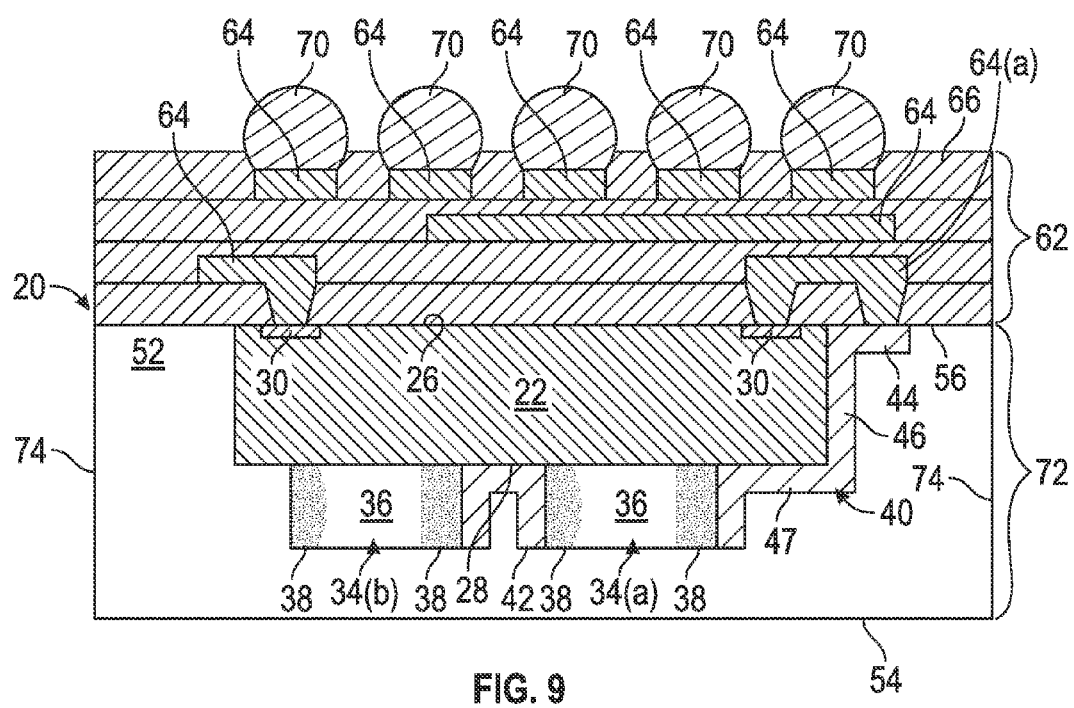

FIG. 9 illustrates FO-WLP 20 in a completed state after singulation of panel 50. Hereafter, the singulated piece of panel 50 included within FO-WLP 20 is identified by reference numeral "72" and referred to as a "molded package body." Singulation imparts package body 72 with substantially vertical sidewalls 74. As can be seen in FIG. 9, completed FO-WLP 20 includes a molded package body 72 containing semiconductor die 22, a number of SMDs 34, and a network or series of printed ink traces including ink traces 40 and 42. As indicated above, mold-embedded trace 40 extends from the frontside of package body 72, along a sidewall of semiconductor die 22, and to SMD 34(*a*); while interconnect line 64(*a*) is formed in ohmic contact with pad region 44 of trace 40 and a bond pad 30 of die 22. Interconnect line 64(*a*) and printed trace 40 thus combine interconnect die 22 with the SMD 34(*a*) stacked thereon, which is not otherwise accessible for electrical interconnection through redistribution layers 62 alone. Although not visible in the cross-section of FIG. 7, additional die-to-SMD interconnections can be formed between die 22 and any of the other SMDs 34 stacked thereon in a similar manner. As further noted above, printed ink trace 42 interconnects SMDs 34(*a*) and 34(*b*), which are wholly embedded within package body 72 and not exposed through the frontside thereof. Mold-embedded trace 40, trace 42, and the other non-illustrated traces thus form a three dimensional metal level, which provides additional interconnectivity within FO-WLP 20 to minimize overall package size and reduce the number redistribution layers 62 required to complete the wiring structure of FO-WLP 20.

Figure 10:
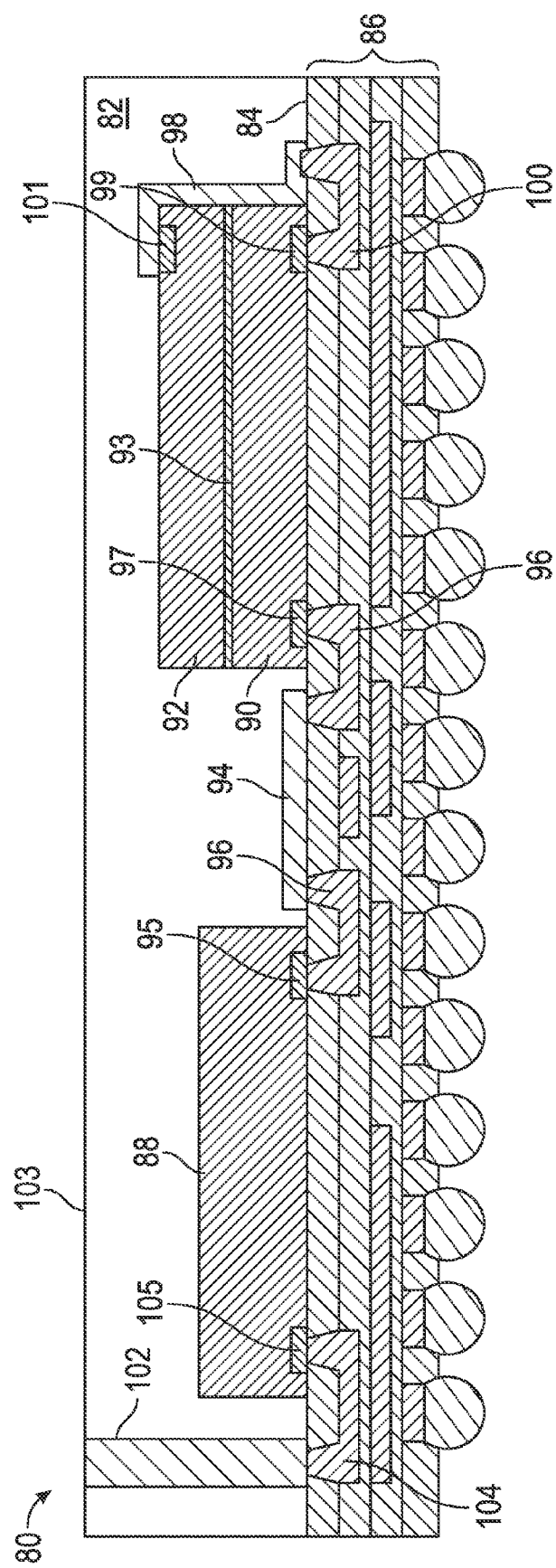
FIG. 10 is a cross-sectional view of a FO-WLP including mold-embedded traces utilized to interconnect multiple semiconductor die contained within the molded packaged body and to provide one or more vias through the package body, as illustrated in accordance with a further exemplary embodiment of the present invention.

There has thus been described an embodiment of a FO-WLP including mold-embedded traces, which interconnect a semiconductor die with one or more SMDs to allow the production of a highly compact SiP device. In further embodiments, the mold-embedded traces can be utilized to interconnect multiple die within the same FO-WLP. Consider, for example, FIG. 10 illustrating a second exemplary FO-WLP 80, which includes a molded package body 82 having a frontside 84 over which a number of redistribution layers 86 have been formed. In this embodiment, three semiconductor die are embedded within package body 82: (i) a first semiconductor die 88, (ii) a second semiconductor die 90, which is position adjacent die 88 in a side-by-side relationship, and (iii) a third semiconductor die 92, which is stacked onto die 90 in a back-to-back relationship and bonded thereto by a layer of die attach material 93. A first electrically-conductive ink trace 94 has been printed or otherwise formed in a region between semiconductor die 88 and 90; and, in conjunction with interconnect lines 96, electrically couples bond pad 95 of die 88 to bond pad 97 of die 90 thereby providing electrical communication therebetween. Similarly, a second electrically-conductive ink trace 98 has been printed to extend from frontside 84 of package body 82, along the sidewalls of stacked die 90 and 92, and onto the frontside of die 92 to ohmically contact a bond pad 101 disposed thereon. An interconnect line 100 interconnects electrically-conductive ink trace 98 to a bond pad 99 of semiconductor die 90. In this manner, interconnect line 100 and trace 98 combine to provide an electrically-conducive path between stacked die 90 and 92 contained within package body 82.

In addition to provide various interconnections within the package body, the mold-embedded traces can be leveraged to provide electrically-conductive paths from the packaged microelectronic devices to external surfaces of the package body. For example, as further shown in FIG. 10, FO-WLP 80 can include an additional electrically-conductive ink trace 102, which assumes the form of a vertical column extending from frontside 84 of package body 82 to the backside 103 thereof. Prior to encapsulation, ink trace 102 can be printed as a freestanding column, which is supported by a temporary substrate (e.g., substrate 24 shown in FIGS. 1-4) and which extends away therefrom in a substantially vertical direction. Such a freestanding column can be produced utilizing three dimensional printing processes of the type described above, such as inkjet printing, aerosol printing, or fine needle dispensing. After printing, electrically-conductive ink trace 102 can be encapsulated, along with ink trace 94, ink trace 98, and die 88, within a molded panel produced utilizing an encapsulation process similar to that described above. If ink trace 102 is covered by excess mold compound or overburden after encapsulation, the molded panel can be ground, polished, or otherwise thinned to reveal ink trace 102 through the panel backside. As indicated in FIG. 10, an interconnect line 104 can then be formed in contact with ink trace 102 and a bond pad 105 of semiconductor die 88 during build-up of the frontside redistribution layers 86 to electrically interconnect die 88 and trace 102. Electrically-conductive ink trace 102 can thus serve as a through-via in the completed package, which provides direct and efficient routing of electrical signals or power between die 88 and the backside of package body 82. If desired, additional vertically-extending ink traces similar to ink trace 102 can likewise be produced at other locations within the molded panel to provide additional through-vias through the panel body.

Figure 11:
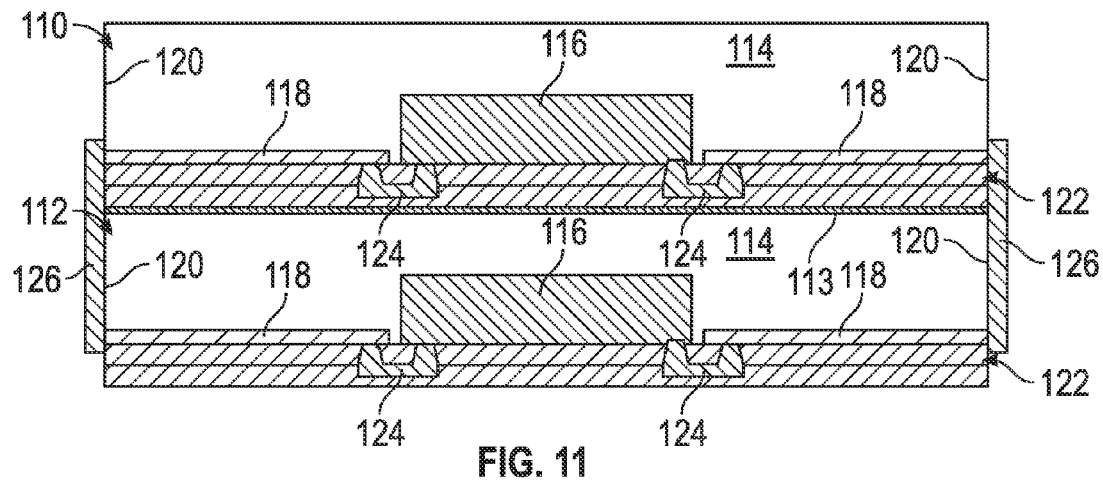
FIGS. 11 and 12 are cross-sectional and top-down cutaway views, respectively, of a two FO-WLPs in a stacked or Package-on-Package configuration and each including printed ink traces, which provide electrically-conductive paths between packaged die and sidewalls of the package body, as illustrated in accordance with a still further exemplary embodiment of the present invention.
Figure 12:
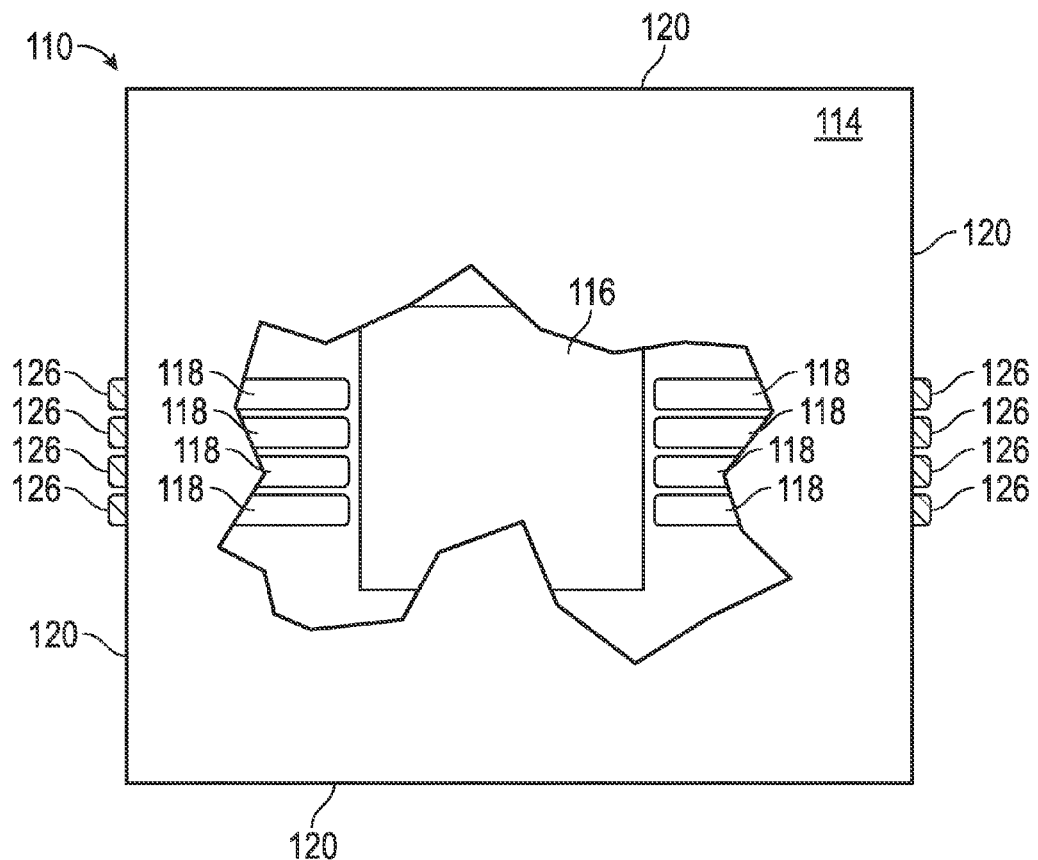

In still further embodiments, the mold-embedded traces can further be leveraged to provide electrically-conductive paths to one or more sidewalls of the package body in addition to or in lieu of the package backside. Such an approach may be particularly useful in embodiments wherein it is desired to interconnection a first FO-WLP with a second package in, for example, a PoP configuration. Further emphasizing this point, FIGS. 11 and 12 are cross-sectional and top-down cutaway views, respectively, of a first and second FO-WLPs 110 and 112 in a stacked PoP configuration. For ease of explanation, FO-WLPs 110 and 112 are illustrated as identical in FIGS. 11 and 12; however, it will be appreciated that packages 110 and 112 can vary in structure, function, and relative positioning in further embodiments. Furthermore, while packages 110 and 112 are both Fan-Out Wafer Level Packages in the illustrated example, this need not always be the case.

FO-WLPs 110 and 112 each include a molded package body 114 in which a semiconductor die 116 is embedded. Packages 110 and 112 can be bonded by an intervening layer of die attach material 113 either in a mold-to-redistribution layer configuration (shown) or in a mold-to-mold (back-to-back) configuration. A number of electrically-conductive printed ink traces 118 are further embedded within molded package body 114 and each extend from a region adjacent die 116 to a sidewall 120 of package body 114. In this particular example, printed ink traces 118 are planar or "two dimensional." Thus, during of fabrication FO-WLPs 110 and 112, traces 118 can be printed exclusively on the temporary substrate utilized to support die 116 during encapsulation. Consequently, while a three dimensional printing process of the type described above can be utilized to produce traces 118, the usage of such a three dimensional printing process is unnecessary. Instead, a two dimensional printing process, such as screen printing, can be utilized to produce printed ink traces 118 during fabrication of FO-WLP 110 and/or FO-WLP 112.

With continued reference to the exemplary embodiment shown in FIGS. 11 and 12, redistribution layers 122 are produced over the frontside of each package body 114 and contain interconnect lines 124, which electrically couple the bond pads of die 116 to the neighboring printed ink traces 118. In this manner, printed ink traces 118 provide electrically-conductive paths between the semiconductor die 116 and sidewalls 120 of stacked packages 110, 112. As further shown in FIGS. 11 and 12, sidewall conductors 126 can be formed on sidewalls 120 of the stacked packages 110, 112 to electrically couple the ink traces 118 exposed therethrough and thereby interconnect die 116. Sidewall conductors 126 can be produced by, for example, depositing a layer of electrically-conductive paste and then removing selected portions of the paste using laser ablation, drilling, or other process. Alternatively, sidewall conductors 126 can be formed via a metal plating and lithographic patterning process similar to that utilized to produce interconnect lines 124. The end result is a highly compact PoP device including two overlying FO-WLPs 110, 112, containing die 116 interconnected through a number of molded-embedded traces 118, as well as through interconnect lines 124 and sidewall conductors 126.

Figure 13:
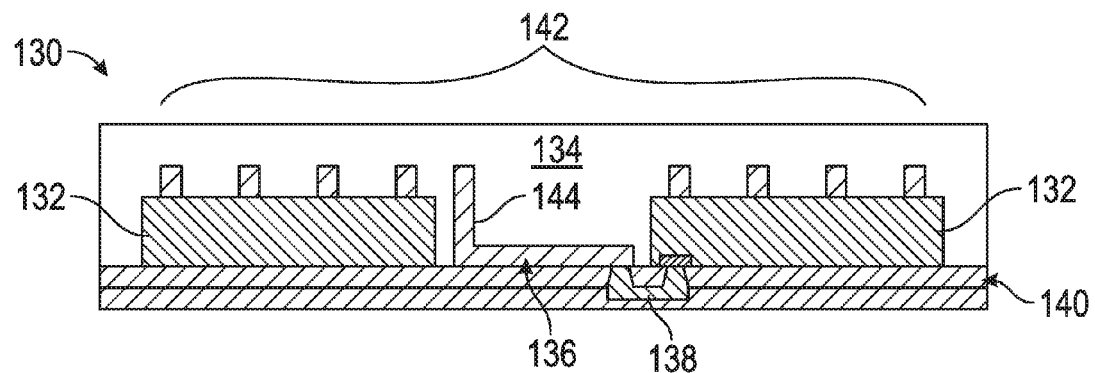
FIGS. 13 and 14 are cross-sectional and top-down cutaway views, respectively, of a FO-WLP including mold-embedded traces electrically coupling a die to a radio frequency antenna structure, which can be printed in conjunction with the traces, as illustrated in accordance with a still further exemplary embodiment of the present invention.
Figure 14:
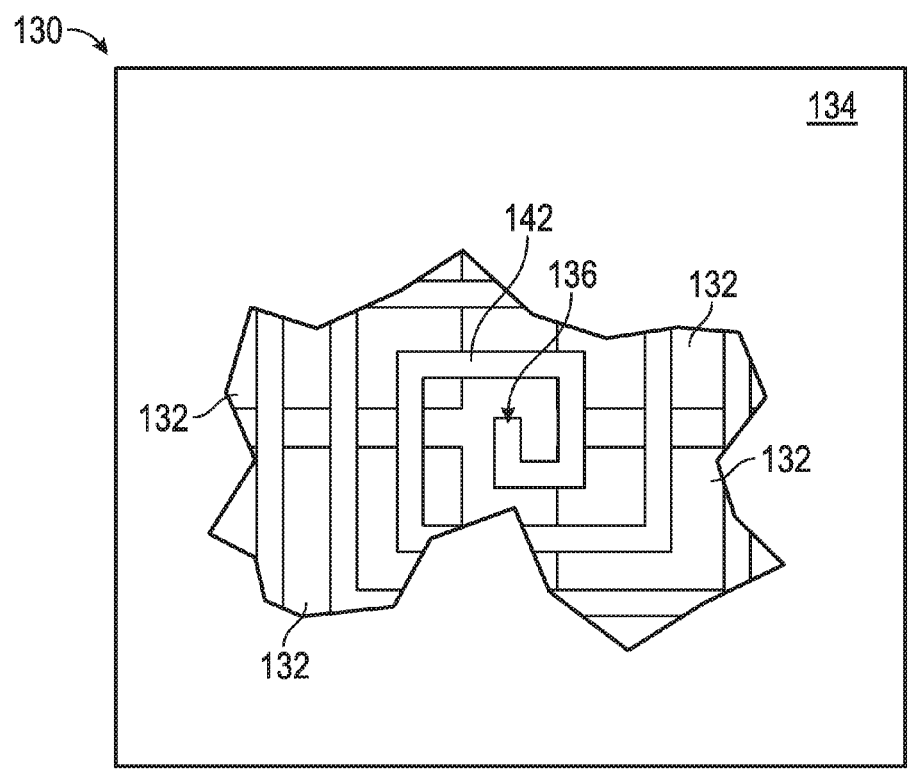

There has thus been described multiple exemplary embodiments of FO-WLPs including mold-embedded traces, such as printed electrically-conductive ink traces, which increase the overall interconnectivity of the package. In further embodiments, the printed ink traces can be utilized to provide electrical interconnection with other functional structures contained within the package body, which can be integrally formed with the ink traces utilizing a common printing process. Such functional structures may include, but are not limited to, printed capacitors, inductors, resistors, and RF antenna structures. Further illustrating this point, FIGS. 13 and 14 are cross-sectional and top-down cutaway views of an exemplary FO-WLP 130, which contains a number of semiconductor die 132 embedded within a molded package body 134. As was previously the case, at least one printed ink trace 136 has further been embedded within package body 134 and is electrically interconnected with one of die 132 by an interconnect line 138 formed within one or more redistribution layers 140 (shown in FIG. 13). However, in this case, mold-embedded trace 136 includes a vertically-extending column portion 144, which extends away from redistribution layers 140 to contact a spiral-shaped RF antenna structure 142 formed over die 132 and, specifically, between the backside of die 132 and the backside of package body 134). While structure 142 can be a prefabricated antenna (e.g., an etched piece of foil positioned over die 132 utilizing a pick-and-place tool prior to encapsulation), antenna structure 142 is preferably produced utilizing a three dimensional printing process of the type described above. In one embodiment, printed ink trace 136 and RF antenna structure 142 are printed as a unitary or continuous metal structure or body, which conforms to the outer surfaces of die 132 and the upper surface of the temporary substrate utilized to support die 132 during encapsulation (and, therefore, the frontside surface of package body 134). In this manner, a highly compact FO-WLP can be produced including an RF antenna structure, which is interconnected to one or more die utilizing any number of mold-embedded traces. This is highly desirable for certain applications.

Figure 15:
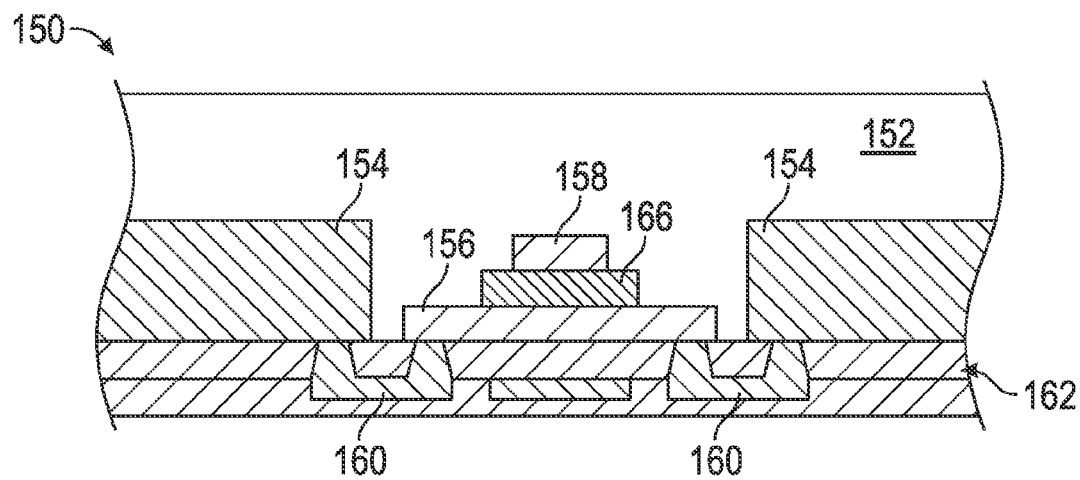
FIGS. 15 and 16 are cross-sectional and top-down cutaway views, respectively, of a FO-WLP including overlying mold-embedded traces electrically isolated by an insulating bridge, as illustrated in accordance with a still further exemplary embodiment of the present invention.
Figure 16:
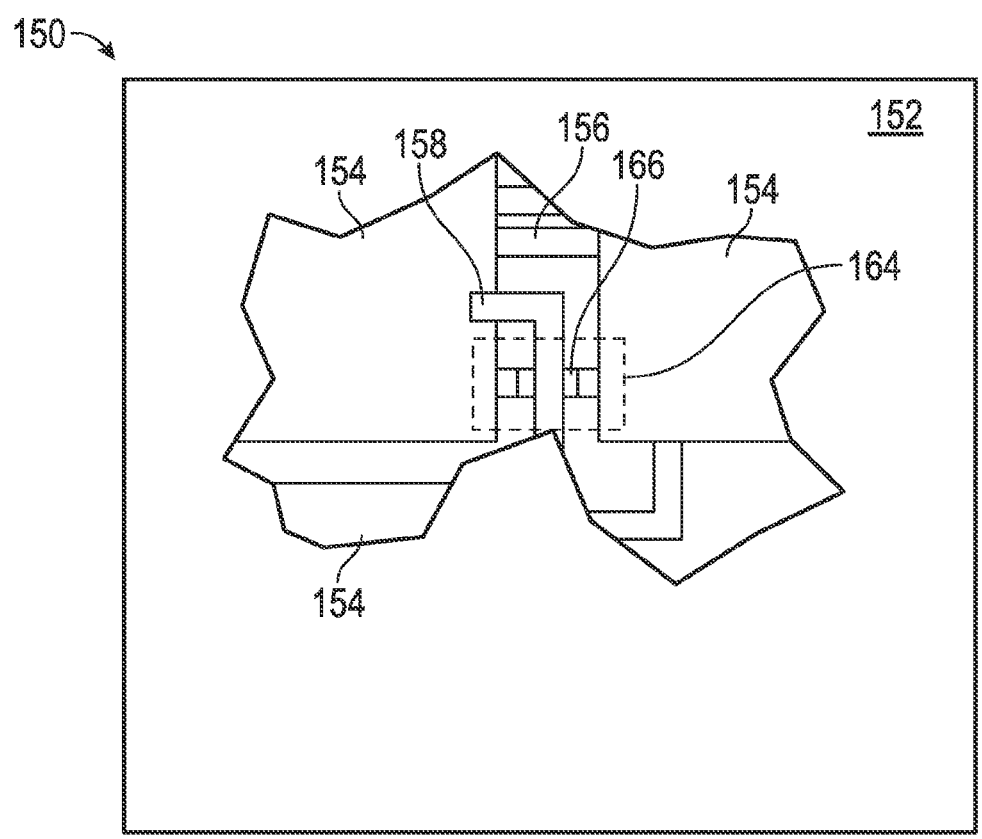

In the above-described exemplary embodiments, the FO-WLPs contained a single layer or level of printed traces. In further embodiments, the FO-WLPs can contain multiple layers or levels of printed traces, which can be electrically isolated from underlying layers by an intervening dielectric material. Further illustrating this point, FIGS. 15 and 16 are cross-sectional and top-down cutaway views, respectively, of a FO-WLP 150, as illustrated in accordance with a still further exemplary embodiment of the present invention. Here, FO-WLP 150 includes a package body 152 containing a number of semiconductor die 154. Embedded within package body 154 are a number of printed electrically-conductive traces 156 and 158, with traces 156 electrically coupled to die 154 by way of interconnect lines 160 formed in redistribution layers 162. Electrically-conductive traces 156 and 158 are formed at different levels within package body 152 and crossover or overlap in region 164 (identified in FIG. 16), as taken along a vertical axis. An insulative bridge 166 is thus formed between these overlapping regions of traces 156 and 158 to provide electrical isolation therebetween. Insulative bridge 166 can be formed as a body of dielectric material, which is deposited over the cross-over region of electrically-conductive ink trace 156 after printing thereof. Insulative bridge 166 can be deposited utilizing a printing process of the type described above, but utilizing mold compound, a non-conductive epoxy, or another flowable dielectric material. After deposition of bridge 166, trace 158 can be printed and the other process steps performed (encapsulation, redistribution layer build-up, formation of a contact array, and panel singulation). In further embodiments, a layer of dielectric material can be globally deposited between each layer or level of printed ink traces by, for example, pour molding a limited volume of the mold compound over each layer of ink traces after printing thereof.

The foregoing has thus provided multiple embodiments of FO-WLPs having traces or circuit embedded within a molded package body. The traces are preferably produced as printed ink traces, which are printed onto and conform with one or more surfaces of the packaged microelectronic devices and/or the temporary substrate utilized to support the microelectronic devices during the encapsulation process. The mold-embedded traces can be utilized for a variety of purposes, including interconnection of semiconductor die with other components contained within the package body, to provide electrically-conductive paths between semiconductor die and external surface of the package body, and/or to provide interconnection to other features within the package body, such as capacitors, resistors, inductors, and/or RF antenna structures, which can be integrally formed with the traces utilizing a common printing process. Through the inclusion of mold-embedded traces, embodiments of the FO-WLP described herein can have increased levels of interconnectivity, volumetric efficiency, design flexibility, and component integration. Additionally, the inclusion of such mold-embedded traces may allow a reduction in the number and/or complexity of the metal levels included within the redistribution layers, which are formed over the molded package body. Such a reduction in the number and/or complexity of the redistribution layers can minimize stresses imparted thereto thereby decreasing the likelihood of redistribution layer delamination during and/or after manufacture of the FO-WLP.

In one embodiment, the above-described method includes the steps or processes of placing a first semiconductor die on a temporary substrate; that is, in contact with at least one surface of the first semiconductor die, the temporary substrate, or both the semiconductor die and the substrate. One or more electrically-conducive traces are formed in contact with at least one of the first semiconductor die and the temporary substrate, and encapsulating the first semiconductor die and the electrically-conductive traces within a molded panel. The electrically-conductive traces can be formed by, for example, printing an electrically-conductive ink onto one or more surfaces of the die and/or the temporary substrate. The temporary substrate is removed to reveal a frontside of the molded panel through which the electrically-conducive traces are at least partially exposed. At least one redistribution layer is formed over the frontside of the molded panel and includes one or more interconnect lines in ohmic contact with the electrically-conducive traces.

In a further embodiment, the method includes the steps/processes of placing an array of semiconductor die on a temporary substrate. printing an embedded metal level conformal with the temporary substrate and one or more surfaces of the semiconductor die, and encapsulating the array of semiconductor die and the embedded metal level within a molded panel. The temporary substrate is removed to reveal a frontside of the molded panel and regions of regions of the embedded metal level. At least one redistribution layer is formed over the frontside of the molded panel, the at least one redistribution layer comprising interconnect lines electrically coupling the semiconductor die to the exposed regions of the embedded metal level. The molded panel is then singulated to yield a plurality of microelectronic packages each including a semiconductor die and an embedded metal level contained within a molded package body.

In a still further embodiment, a FO-WLP or other microelectronic package is provided including a molded package body and semiconductor die, which is embedded within the molded package body. One or more redistribution layers are formed over the molded package body and containing interconnect lines electrically coupled to the semiconductor die. Printed electrically-conductive ink traces are embedded within the molded package body and electrically coupled to the semiconductor die through the interconnect lines. In certain embodiments, the printed electrically-conductive ink traces can extend over and may be conform with one or more surfaces of the semiconductor die.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes can be made in the function and arrangement of elements described in an exemplary embodiment without departing from the scope of the invention as set-forth in the appended claims.

The foregoing Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or Detailed Description. As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. The term "coupled" is further defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

What is claimed is:

1. A method for fabricating a microelectronic package, the method comprising:
   placing a first semiconductor die on a temporary substrate;
   placing a first Surface Mount Device (SMD) on a backside of the first semiconductor die;
   after placing the first SMD on the backside of the first semiconductor die, forming an electrically-conducive trace to extend from the temporary substrate, along a sidewall of the first semiconductor die, and to a terminal of the first SMD;

encapsulating the first semiconductor die, the first SMD, and the electrically-conductive trace within a molded panel;

removing the temporary substrate to reveal a frontside of the molded panel through which the electrically-conducive trace is at least partially exposed; and forming at least one redistribution layer over the frontside of the molded panel, the at least one redistribution layer comprises an interconnect line in ohmic contact with the electrically-conducive trace.

2. The method of claim 1 wherein forming the electrically-conductive trace comprises printing the electrically-conductive ink trace on at least one of the first semiconductor die and the temporary substrate.

3. The method of claim 2 wherein printing comprises printing the electrically-conductive ink trace on a sidewall of the first semiconductor die.

4. The method of claim 2 wherein printing comprises printing the electrically-conductive ink trace to include an enlarged pad region in contact with the temporary substrate, and wherein forming comprises forming the interconnect line in ohmic contact with the enlarged pad region.

5. The method of claim 1 further comprising positioning a plurality of SMDs in an array on a backside of the first semiconductor die, the first SMD included in the plurality of SMDs; and wherein forming comprises forming the electrically-conductive trace to interconnect the plurality of SMDs.

6. The method of claim 2 wherein printing comprises printing the electrically-conductive ink trace on the temporary substrate as a freestanding, vertically-extending column.

7. The method of claim 6 further comprising producing the molded panel to have a backside opposite the frontside through which the vertically-extending column is exposed.

8. The method of claim 1 wherein encapsulating comprises encapsulating a second semiconductor die with the first semiconductor die in the molded panel; and wherein forming comprises forming the electrically-conductive trace to interconnect the first and second semiconductor die.

9. The method of claim 8 further comprising stacking the first and second semiconductor die in a back-to-back relationship prior to encapsulating the first and second semiconductor die in the molded panel.

10. The method of claim 2 further comprising forming a radio frequency antenna structure electrically coupled to the first semiconductor die through the electrically-conductive ink trace.

11. The method of claim 10 wherein forming a radio frequency antenna structure comprises printing the radio frequency antenna structure.

12. The method of claim 1 wherein the first semiconductor die comprises a bond pad, and wherein forming at least one redistribution layer comprises forming at least one redistribution layer to contain an interconnect line electrically coupling the bond pad to the electrically-conductive trace.

13. The method of claim 1 further comprising singulating the molded panel to define a molded package body in which the semiconductor die and the electrically-conductive trace are embedded, the molded package body having a sidewall to which the electrically-conductive trace extends.

14. The method of claim 13 further comprising forming a sidewall conductor on the sidewall of the molded package body and in ohmic contact with the electrically-conductive trace.

15. The method of claim 1 wherein forming the electrically-conductive trace comprises printing a first electrically-conductive ink trace onto at least one of the first semiconductor die and the temporary substrate; and wherein the method further comprises:
depositing a dielectric material onto at least a cross-over region of the first electrically-conductive ink trace; and printing a second electrically-conductive ink trace extending over the cross-over region of the first electrically-conductive ink trace.

16. The method of claim 1 further comprising selecting the SMD from the group consisting of a discrete two terminal resistor, a discrete two terminal capacitor, a discrete two terminal indicator, and a discrete two terminal diode.

17. A method for fabricating a microelectronic package, the method comprising:

placing a semiconductor die on a temporary substrate;

dispensing a metal-containing ink onto selected regions of at least one of the semiconductor die and the temporary substrate to produce at least a first electrically-conducive ink trace;

encapsulating the semiconductor die and the first electrically-conductive ink trace within a molded panel;

removing the temporary substrate to reveal a frontside of the molded panel through which the first electrically-conducive trace is at least partially exposed; and forming at least one redistribution layer over the frontside of the molded panel, the at least one redistribution layer comprises an interconnect line in electrical contact with the first electrically-conducive ink trace.

18. The method of claim 17 wherein dispensing comprises dispensing the metal-containing ink utilizing a printing technique selected from the group consisting of inkjet printing, aerosol printing, fine needle dispensing, and screen printing.

19. The method of claim 17 further comprising curing the metal-containing ink utilizing a thermal or ultraviolet curing process after dispensing the metal-containing ink onto selected regions of at least one of the semiconductor die and the temporary substrate.

20. The method of claim 17 further comprising placing first and second Surface Mount Devices (SMDs) in a side-by-side relationship on a backside of the semiconductor die prior to dispensing the metal-containing ink;

wherein dispensing comprises dispensing the metal-containing ink onto selected regions of the semiconductor die such that the first electrically-conductive ink trace extends from a terminal of the first SMD, along the backside of the semiconductor die, and to a terminal of the second SMD to electrically interconnect the first and second SMDs; and wherein encapsulating comprises encapsulating the first and second SMDs in the molded panel along with the semiconductor die and the first electrically-conductive trace.

* * * * *